(12) United States Patent
Acosta Alba et al.

(10) Patent No.: US 11,195,711 B2
(45) Date of Patent: Dec. 7, 2021

(54) HEALING METHOD BEFORE TRANSFER OF A SEMICONDUCTING LAYER

(71) Applicant: COMMISSARIAT À L'ÉNERGIE ATOMIQUE ET AUX ÉNERGIES ALTERNATIVES, Paris (FR)

(72) Inventors: Pablo Acosta Alba, Grenoble (FR); Frédéric Mazen, Grenoble (FR); Sébastien Kerdiles, Grenoble (FR); Sylvain Maitrejean, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/732,950

(22) Filed: Jan. 2, 2020

(65) Prior Publication Data
US 2020/0219719 A1 Jul. 9, 2020

(30) Foreign Application Priority Data
Jan. 7, 2019 (FR) ..................................... 1900126

(51) Int. Cl.
*H01L 21/00* (2006.01)
*H01L 21/02* (2006.01)
*H01L 21/762* (2006.01)

(52) U.S. Cl.
CPC .. *H01L 21/02032* (2013.01); *H01L 21/76254* (2013.01)

(58) Field of Classification Search
None
See application file for complete search history.

(56) References Cited

U.S. PATENT DOCUMENTS

| | | | |
|---|---|---|---|
| 7,732,301 B1* | 6/2010 | Pinnington | H01L 21/2654 438/455 |
| 8,993,461 B2 | 3/2015 | Radu et al. | |
| 2002/0053318 A1 | 5/2002 | Levy et al. | |
| 2009/0029525 A1* | 1/2009 | Ohnuma | H01L 21/76254 438/458 |
| 2009/0269906 A1 | 10/2009 | Kato et al. | |
| 2010/0216295 A1* | 8/2010 | Usenko | H01L 21/76254 438/470 |
| 2013/0029474 A1* | 1/2013 | Gaudin | H01L 21/76254 438/458 |

(Continued)

OTHER PUBLICATIONS

Mandal et al. "Preparation of homogeneous barium borosilicate glass using microwave energy," 2013, Journal of Non-Crystalline Solids 371-372 (2013) 41-46. (Year: 2013).*

(Continued)

*Primary Examiner* — Reema Patel
(74) *Attorney, Agent, or Firm* — Pearne & Gordon LLP

(57) ABSTRACT

A method of healing defects generated in a semiconducting layer by implantation of species made in a substrate to form therein an embrittlement plane separating a solid part of the substrate from the semiconducting layer, the semiconducting layer having a front face through which the implanted species pass. The method comprises local annealing of the substrate causing heating of the semiconducting layer, the intensity of which decreases from the front face towards the embrittlement plane. The local annealing may comprise a laser irradiation of a front surface of the substrate.

16 Claims, 2 Drawing Sheets

(56) References Cited

U.S. PATENT DOCUMENTS

| | | |
|---|---|---|
| 2013/0187276 A1 | 7/2013 | Ernst et al. |
| 2014/0113434 A1 | 4/2014 | Tauzin et al. |
| 2015/0044828 A1 | 2/2015 | Batude et al. |
| 2015/0179474 A1 | 6/2015 | Maitrejean et al. |
| 2015/0179665 A1 | 6/2015 | Reboh et al. |
| 2016/0005862 A1 | 1/2016 | Reboh et al. |
| 2016/0020153 A1 | 1/2016 | Batude et al. |
| 2016/0071933 A1 | 3/2016 | Maitrejean et al. |
| 2016/0254362 A1 | 9/2016 | Maitrejean et al. |
| 2016/0300927 A1 | 10/2016 | Reboh et al. |
| 2017/0076944 A1 | 3/2017 | Augendre et al. |
| 2017/0141212 A1 | 5/2017 | Barraud et al. |
| 2017/0263495 A1 | 9/2017 | Augendre et al. |
| 2017/0263607 A1 | 9/2017 | Maitrejean et al. |

OTHER PUBLICATIONS

Search Report for French application No. 1900126 dated Aug. 20, 2019.
White, C. W. et al. Laser Annealing of Ion-Implanted Semiconductors: IN: Science, May 4, 1979, vol. 204, No. 4392, pp. 461-468.
Kawaguchi, Norihito et al. "Pulsed Green-Laser Annealing for Single-Crystalline Silicon Film Transferred onto Silicon wafer and Non-alkaline Glass by Hydrogen-Induced Exfoliation" IN: Japanese Journal of Appied Physics, Jan. 1, 2007, vol. 46, No. 1, pp. 21-23.
U.S. Appl. No. 16/671,352 titled "Bonding Method With Electron-Stimulated Desorption", filed Nov. 1, 2019.

\* cited by examiner

HEALING METHOD BEFORE TRANSFER OF A SEMICONDUCTING LAYER

CROSS-REFERENCE TO RELATED APPLICATIONS

This application claims priority from French Patent Application No. 19 00126 filed on Jan. 7, 2019. The content of this application is incorporated herein by reference in its entirety.

TECHNICAL FIELD

The field of the invention is methods of transferring a semiconducting layer from a donor substrate to a receiving substrate that make use of a fracture along an embrittlement plane formed by implantation of species in the donor substrate. The invention more particularly relates to the healing of defects caused by implantation.

PRIOR ART

The Smart Cut™ technology is a well-known technique for transferring thin layers of semiconducting materials. According to this technique, ion species such as hydrogen and/or helium are implanted in a donor substrate so as to form an embrittlement plane. The donor substrate is then brought into contact with a receiving substrate, for example by direct bonding. This technique then makes use of the development of defects generated in the embrittlement plane. This development implies an energy input, generally made by means of a heat treatment at a few hundred degrees, typically 500° C., during a few tens of minutes. This leads to the formation of a confined layer of cavities and microcracks within which a fracture will initiate and propagate. This fracture separates the donor substrate along the embrittlement plane and a thin layer from the donor substrate is thus transferred onto the receiver substrate.

After the transfer, there are defects present in the transferred thin layer through which the implanted species penetrated. These defects can in particular correspond to defects in the crystalline lattice of the layer or residues of implanted species. Such defects strongly degrade functioning of electronic devices formed in the transferred layer. Therefore they have to be healed. The technique usually used for this healing is a high temperature heat treatment. This heat treatment generally reaches temperatures exceeding 900° C., typically 1100-1200° C. and lasts for a few seconds (about 30 seconds for Rapid Thermal Annealing (RTA) or a few minutes or even a few hours in a vertical furnace. In all cases, the entire receiving substrate on which the thin layer was transferred has received a heat treatment at well above 500° C.

Nevertheless application of this healing technique is not conceivable when the thin layer is transferred onto a receiving substrate that could be damaged by the application of a heat treatment at high temperature. For example, this is the case for polymer substrates used particularly in flexible electronics or on glass substrates that melt at a temperature of approximately 600° C. This is also the case for a sequential 3D integration in which substrates already have partially or fully manufactured components and therefore may comprise copper tracks that degrade starting at about 400° C.-500° C., nickel silicide contacts for which conductivity can be deteriorated at beyond 550° C., etc.

To satisfy the need to limit the thermal budget (temperature/duration) applied to the receiving substrate, an alternative healing solution has been proposed that consists of irradiating the receiving substrate by laser after the thin layer has been transferred, as disclosed in U.S. Pat. No. 8,993,461 B2. But this solution requires a thermally insulating layer between the transferred layer and the receiving substrate so that it does not heat the receiving substrate. Furthermore, a monocrystalline germ must necessarily be kept in the lower part of the layer, so that the transferred layer can be healed by partial fusion and then recrystallisation. But this germ is then the least well reconstructed part although this part forms the only useful part in the case for example of a thin silicon on insulator substrate.

Another alternative healing solution consists of generating a partial amorphisation of the transferred thin layer, usually by ion implantation. This amorphisation is followed by a Solid Phase Epitaxial Regrowth (SPER) recrystallisation annealing. Knowing that the SPER annealing requires a thermal budget similar to that used to trigger the fracture, this solution cannot be implemented before the donor substrate is bonded to the receiver substrate. Furthermore, a part of the transferred thin layer must be left without any amorphisation, to enable recrystallisation during the SPER annealing. Consequently, defects close to the bottom of the layer cannot be healed. Finally, there are difficulties with SPER recrystallisation in recrystallising the last few nanometres close to the surface due to different recrystallisation rates along the different crystalline directions and the presence of stack defects along the crystalline direction (111).

PRESENTATION OF THE INVENTION

The purpose of the invention is to disclose a solution for healing defects related to the implantation that can be made at relatively low temperature and thus be applied to the transfer of a semiconducting layer on a receiving substrate with characteristics that prevent high temperature heat treatments and that overcomes the disadvantages of the alternative solutions discussed above.

To achieve this, the invention discloses a method of healing defects generated in a semiconducting layer by implantation of species made in a substrate to form an embrittlement plane in the substrate separating a solid part of the substrate from the semiconducting layer. The semiconducting layer comprises a front face through which the implanted species pass. This method comprises local annealing of the substrate causing heating of the semiconducting layer, the intensity of which decreases from the front face towards the embrittlement plane.

Some preferred but non-limitative aspects of this method are as follows:
the local annealing comprises a laser irradiation of a front surface of the substrate;
the laser irradiation is a pulse irradiation for which the operating conditions are chosen to heat a front portion of the semiconducting layer without causing the formation of bubbles in the embrittlement plane;
the substrate is made of silicon, germanium or silicon-germanium and the laser irradiation has a wavelength of less than 400 nm;
the duration of the laser irradiation pulse(s) is less than one microsecond, preferably between 20 and 200 nanoseconds;
the laser irradiation pulse(s) (has) have a surface energy density chosen to heat the front portion of the semiconducting layer to a temperature of more than 1000° C., and preferably more than 1200° C.
the laser irradiation comprises one or several pulses, each having an energy density chosen to not cause fusion of the front surface;

the laser irradiation comprises a single pulse, with an energy density chosen to cause fusion of the front surface;

the semiconducting layer is covered by a control layer that has a melting temperature below the melting temperature of the semiconducting layer;

the method comprises a surface amorphisation of the semiconducting layer before the local annealing;

the method also includes heating of the entire substrate to a temperature chosen to not cause the formation of bubbles in the embrittlement plane, for example to a temperature of between 50° C. and 450° C.;

The invention also relates to a method of transferring from a donor substrate to a receiving substrate a semiconducting layer with a front face, the donor substrate comprising a embrittlement plane formed by implantation of species that separates the semiconducting layer from a solid part of the donor substrate, the method comprising the following steps:

contracting the donor substrate and the receiving substrate to form an assembly to be fractured;

fracturing the assembly to be fractured along the embrittlement plane so as to transfer the semiconducting layer onto the receiving substrate;

characterised in that it comprises before contracting healing of defects in the semiconducting layer related to implantation of species through the front face, said healing including local annealing of the donor substrate causing heating of the semiconducting layer with an intensity that decreases from the front face towards the embrittlement plane.

According to this transfer method, the fracturing may include a weakening heat treatment applied to the assembly to be fractured that heats the embrittlement plane to a temperature higher than the temperature to which it is heated by the local annealing.

This transfer method may include thinning of the semiconducting layer transferred onto the receiving substrate.

BRIEF DESCRIPTION OF THE DRAWINGS

Other aspects, purposes, advantages and characteristics of the invention will become clear after reading the following detailed description of preferred embodiments of the invention, given as non-limitative examples, with reference to the appended figures among which.

DETAILED DESCRIPTION

The invention relates to a method of healing defects generated in a semiconducting thin layer by implantation of species made in a semiconducting substrate called a donor substrate, to form therein an embrittlement plane separating the thin layer from a solid part of the substrate. One particular application of the invention is the transfer of the semiconducting layer onto a receiving layer according to the Smart Cut™ technology, and more particularly onto a receiving substrate with characteristics that make high temperature heat treatments impossible.

The method according to the invention comprises local annealing of the donor substrate to heal defects present in the semiconducting layer due to implantation. This in-depth selective annealing causes heating of the semiconducting layer with an intensity that decreases with the depth from a front face of the semiconducting layer towards the embrittlement plane and is therefore maximum close to the front face. This decrease in the intensity of heating results in preferential heating of the damaged zone through which ion implantation has taken place at very high temperature so that defects related to the implantation can be healed. And since the temperature increase is confined to a front portion of the semiconducting layer, the embrittlement plane is not heated which would cause the formation of bubbles, in other words maturing of microcavities in the embrittlement plane that, in the absence of a stiffener added onto the donor substrate, would lead to a deformation of its surface that could hinder bonding with the receiving substrate.

Thus, in the framework of the Smart Cut™ method, this local annealing will not generate any bubble formation and therefore can be done before the donor and receiving substrates are bonded, the weakening heat treatment of the embrittlement plane leads to transfer of the semiconducting layer that can then be done a posteriori. The semiconducting layer is then healed before it has been transferred. In this way, the only temperature change imposed on the receiving substrate that can be sensitive to temperature is the weakening heat treatment, that is done at a sufficiently low temperature (typically less than 500° C.) and/or for a sufficiently short period to guarantee the integrity of the receiving substrate or its components.

Figure 1:
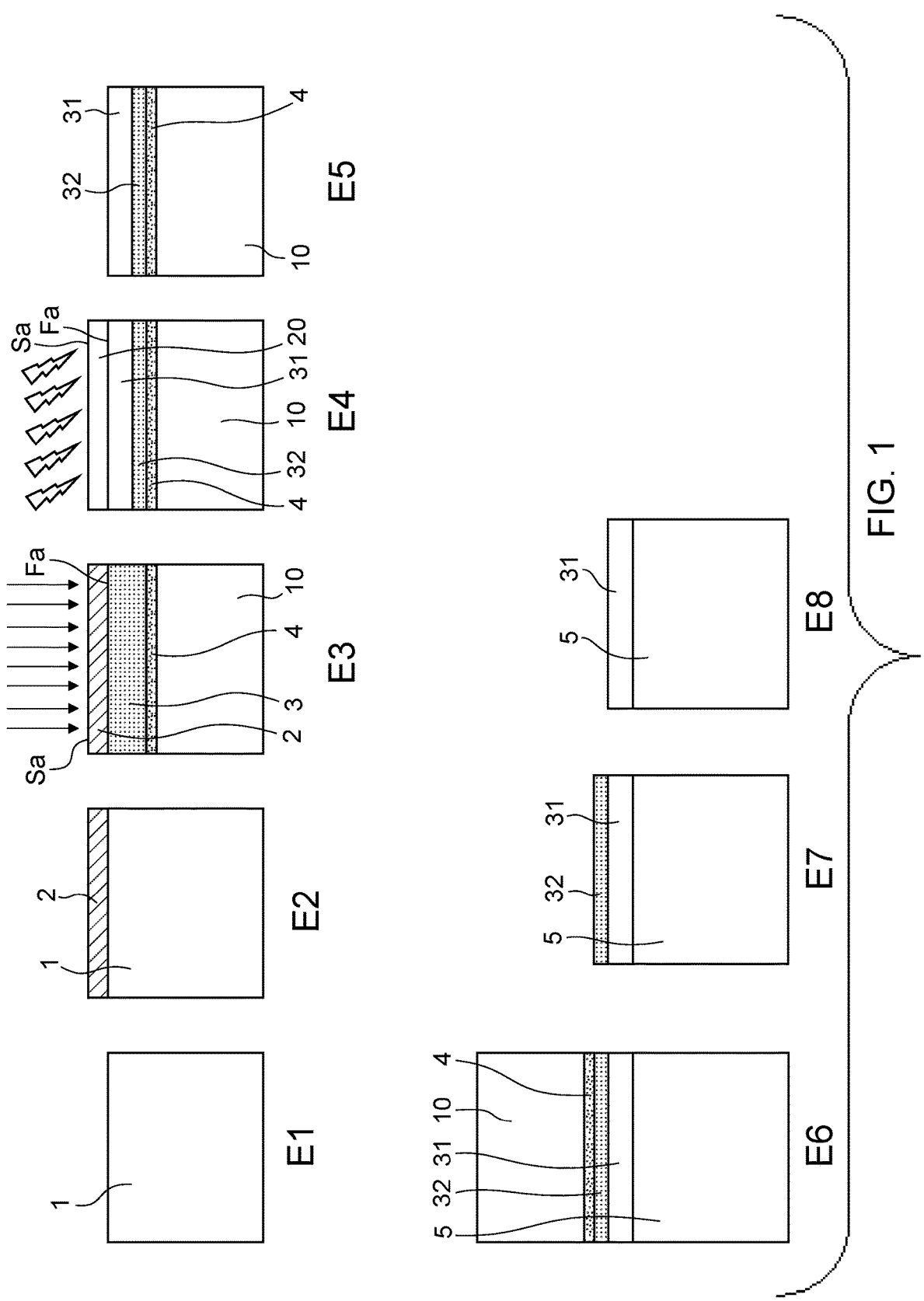
FIG. 1 illustrates an example of a method of transferring a thin semiconducting layer in which defects related to the implantation are healed according to the invention.

The following describes different steps E1-E8 in a method for transferring a semiconducting layer from a donor substrate to a receiving substrate in which the healing method according to the invention is used, with reference to FIG. 1.

The method begins with a step E1 to supply a donor substrate 1 that may be a silicon substrate, or any other semiconducting material. Examples include silicon-germanium, germanium or an III-V material.

In an optional step E2, the donor substrate is covered with a control layer 2 by means of a deposit or epitaxial growth, the usefulness of which will be described below.

The method then includes a step E3 to form an embrittlement plane 4 in the thickness of the donor substrate. This embrittlement plane is formed more particularly by submitting a front surface Sa of the donor substrate to an implantation of species, typically hydrogen and/or helium. The embrittlement plane 4 delimits a semiconducting layer 3 (in this case covered by the control layer 2) and a solid part of the donor substrate 10. The semiconducting layer comprises a back face in contact with the embrittlement plane and a front face Fa opposite the back face. The species pass through the semiconducting layer 3 from its front face during implantation and cause defects in it that need to be healed. This embrittlement plane is typically between 250 and 300 nm under the surface. This depth can be adjusted by varying the implantation conditions and more particularly the implantation energy.

Figure 2:
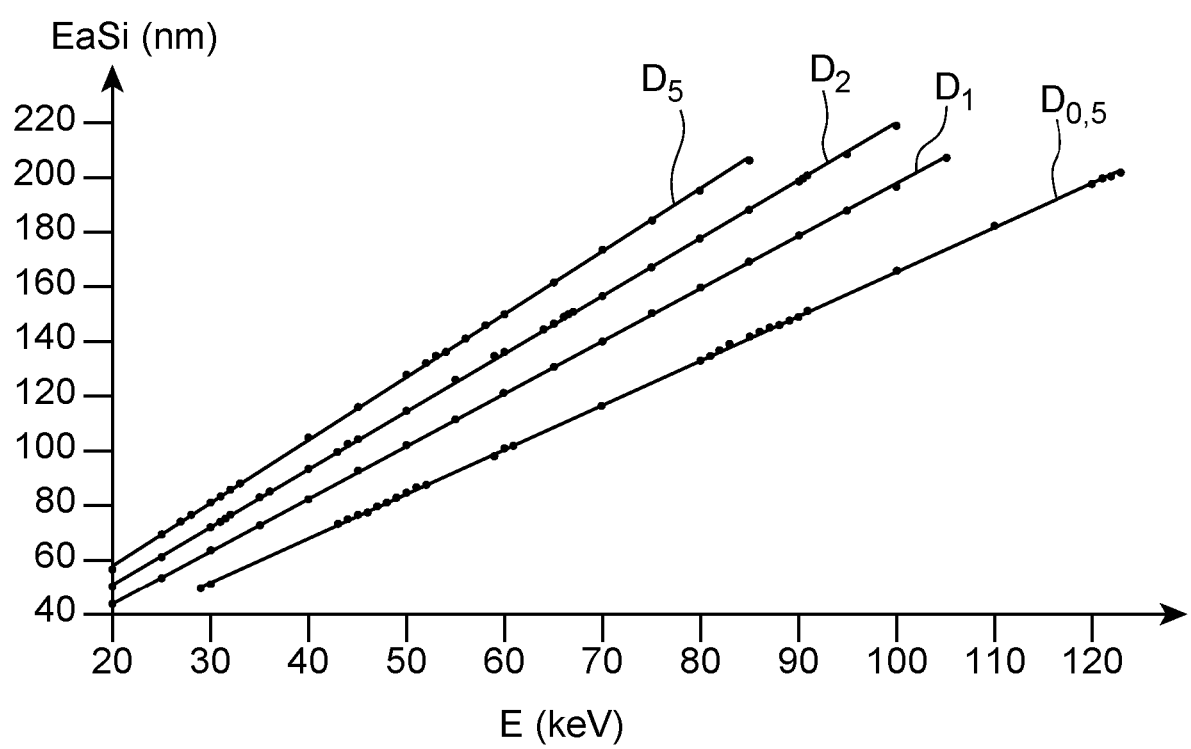
FIG. 2 represents a thickness of silicon amorphised by a silicon implantation, as a function of different implantation conditions.

In an optional step E3', the donor substrate may be subjected to a surface amorphisation step of the semiconducting layer, for example using ion implantation, to form an amorphous surface zone. This implantation may in particular be based on one or several of the following species: silicon, germanium, phosphorus, arsenic, nitrogen or argon with a dose of typically between $10^{14}$ and $10^{16}$ at/cm². FIG. 2 represents the thickness of a silicon zone EaSi made amorphous by means of a silicon implantation as a function of the implantation energy E for different implantation doses ($D_{0.5}$: $5 \times 10^{14}$ at/cm²; $D_1$: $10 \times 10^{15}$ at/cm²; $D_2$: $2 \times 10^{15}$ at/cm²; $D_5$: $5 \times 10^{15}$ at/cm²)

During this step E3', the amorphous zone is preferably more than 100 nm, or even more than 150 nm, from the embrittlement plane so as to not hinder subsequent generation of the fracture wave. Since the amorphous material has a lower melting temperature, the subsequent healing step will require a much lower annealing temperature. Creation of this amorphous zone can also enable better control of this healing. This amorphous zone will be recrystallised during the healing annealing described below.

To heal the defects present in the semiconducting layer 3, as described above, the invention discloses the use of localised annealing for the implanted donor substrate. This annealing is done during a step E4 in the transfer method. It results in a healed control layer 20 and a front portion 31 of the thin layer (including the possibly recrystallised amorphous zone) that is also healed. A back portion 32 of the thin layer in contact with the embrittlement plane 4 cannot be healed, due to the depth selectivity of the annealing.

Following the healing, the transfer method includes removal of the healed control layer during a step E5, and during a step E6, bringing the donor substrate into contact with a receiving substrate 5 to form an assembly to be fractured. This formation can be made by direct assembly, for example by molecular bonding. Then, after contact has been made, the method includes a step E7 to fracture the assembly to be fractured along the embrittlement plane 4 that leads to detachment of the semiconducting layer 31, 32 from the donor substrate and its transfer to the receiving substrate. This fracture includes a weakening heat treatment applied to the assembly to be fractured. This heat treatment provides sufficient energy for a fracture to wave propagate in a self-sustained manner, once it has been initiated. In a first variant, the weakening heat treatment alone is sufficient to initiate the fracture wave. In a second variant, the transfer method comprises additional local energy input after or during the weakening heat treatment to initiate the fracture wave. This energy may be of mechanical or thermal origin, or any other origin. It may for example be local heating done by a laser or by input of ultrasound energy.

The semiconducting layer may then be thinned in a step E8 so as to keep only a useful thickness corresponding at most to the healed front portion 31.

Thus, the transfer method comprises healing of defects in the semiconducting layer related to implantation of species, before the donor and receiving substrates are brought into contact. As indicated above, this healing comprises local annealing of the donor substrate provoking heating of the semiconducting layer 3, the intensity of which is maximum on the surface and decreases from the front face Fa of the semiconducting layer 3 in the direction of the embrittlement plane 4. This in-depth selective annealing can be made in particular by applying laser irradiation to the front surface of the donor substrate. The laser irradiation may be done at atmospheric pressure or under a vacuum, preferably under an inert atmosphere or under a reducing atmosphere.

The laser irradiation is preferably a pulse irradiation for which the operating conditions are chosen to heat the front portion 31 of the semiconducting layer without causing the formation of bubbles in the embrittlement plane 4.

In particular, the laser irradiation wavelength is preferably chosen to result in strong absorption of radiation by the material of the donor substrate. In this way, the essential part of the radiation transferred to the implanted donor substrate can be absorbed in the first nanometres, typically in the first 50 nm of material. For example, a laser with a wavelength of less than 400 nm will be chosen in the case in which the donor substrate is made of silicon, germanium or silicon-germanium.

The duration of a laser pulse is chosen to be sufficiently short so that heat deposited in the first nanometres does not have time to diffuse to a significant depth as far as the embrittlement plane, otherwise bubble formation will occur. For example, in the case of a donor substrate with a embrittlement plane located at a depth of between 150 and 1500 nm from the front face of the semiconducting layer, the pulse duration is chosen to be less than one microsecond, typically between 20 and 200 ns.

Other operating conditions of the laser irradiation that can be controlled are the surface energy density and the number of pulses irradiating the same surface region. These other conditions are chosen so as to reach a sufficient temperature so that the healed front portion 31 of the semiconducting layer is at least as thick as the useful thickness of the semiconducting layer in the final component. For example, it may be decided to transfer a 250 nm thick semiconducting layer so that in fine all that is kept is the last nanometres (5 to 30 nm for a very thin useful layer, or 50 to 150 nm for a thicker useful layer). The laser annealing thus heals the crystal on this useful thickness of the semiconducting layer. For a silicon donor substrate, the energy density is then chosen to exceed 1000° C., and even better 1200° C., throughout the entire useful thickness.

Two laser annealing regimes can be distinguished, namely a regime below fusion and a region going beyond fusion. According to the regime below fusion, healing takes placed by laser annealing that comprises one or several pulses, each having an energy density chosen to not cause fusion of the irradiated surface. According to the regime beyond fusion, healing takes placed by laser annealing that may comprise only a single pulse with a higher energy density chosen to cause fusion of the irradiated surface. In the framework of this regime beyond fusion, the substrate may be covered (by deposition or epitaxial growth) of a control layer 2 made of a material that has a lower melting temperature than the material in the semiconducting layer (for example an SiGe control layer for an Si donor substrate). The laser annealing then melts only the control layer and not the subjacent semiconducting layer. Melting of the control layer can be detected in real time during the laser annealing by measuring the variation of the reflectivity of the stack by TRR ("Time Resolved Reflectometry") reflectometry. In this way, it is possible to have an idea of the temperature reached on the surface of the donor substrate during laser annealing. The control layer can possibly then be removed for example by selective etching, particularly if the surface roughness is not compatible with later bonding.

In one possible embodiment, the temperature of the donor substrate is raised before and during laser annealing by means of a heating element configured to heat the entire donor substrate to a temperature chosen so as to not cause any bubble formation in the embrittlement plane, for example at a temperature of between 50° C. and 450° C.

Due to a sufficiently short laser annealing (less than one microsecond) and a carefully selected wavelength (less than 600 nm), the invention limits surface heating to a volume very close to the surface of the donor substrate. This means that the zone damaged by ion implantation is heated preferentially by ion implantation over a depth dependent on the wavelength and the duration of the laser pulse. This method can be used to rise to very high temperatures (even up to melting of the material in the semiconducting layer) in the front portion 31 of the semiconducting layer, while confining this heating to avoid causing the formation of bubbles in the embrittlement plane 4. In addition to healing defects related to implantation and thus to restore the initial electrical properties of the semiconducting material, these high temperatures can also enable activation of dopants or other high temperature heat treatments that cannot be used with substrates that might be damaged. Due to the use of laser annealing even before bonding, constraints related to thermal budget limitations, such as the need to have a thermally insulating layer, can be overcome.

In one possible embodiment, the laser annealing can irradiate a surface area that can vary between a few $mm^2$ and a few $cm^2$. The shape and size of this surface can be controlled using masks. Part of the substrate rather than other parts is thus annealed preferentially so that the thin layer can be locally healed.

First Example Embodiment of the Invention

This first example relates to the transfer of a thin layer of monocrystalline silicon and a layer of $SiO_2$ insulation on a receiving substrate comprising partially or completely fabricated electronic components and consequently integrating layers sensitive to the temperature, particularly buried copper lines. The presence of these sensitive layers makes application of a heat treatment to the receiving substrate at a temperature higher than 400° C. impractical.

After ion implantation of the donor substrate by hydrogen, this substrate is irradiated with a pulsed laser within the ultraviolet wavelength (350 to 450 nm), with a pulse duration less than 200 ns and a rectangular beam with a size approximately equal to 26×36 $mm^2$. The entire surface of the donor substrate is irradiated using about 260 laser firings. These firings have a coverage of about 500 μm to achieve uniform treatment over the entire surface of the substrate. The laser power is chosen to melt part of the layer to be transferred without the formation of bubbles in the embrittlement plane. The surface energy density is chosen so as to heal the crystal of the donor substrate between its front surface and a depth of about 100 nm. After this laser treatment, a chemical-mechanical polishing step can be made on the donor substrate to reduce the surface roughness and enable it to bond with the receiving substrate. Once the donor and receiver substrates have been bonded, a weakening heat treatment is made on them at 400° C. to trigger fracture and enable transfer of the silicon layer, a thickness of which has already been healed. The transferred layer can then be thinned by chemical etching or by chemical-mechanical polishing to reach a useful thickness equal to not more than the thickness healed by annealing. The thin layer thinned to 100 nm or less no longer has any defects and its electrical properties are equivalent to those of a perfectly crystalline layer that has not been implanted. New components can be fabricated on the thinned transferred layer, enabling 3D integration.

Second Example Embodiment of the Invention

In this second example, the donor substrate is a monocrystalline silicon substrate covered with a 10 nm thick layer of $Si_{0.90}Ge_{0.10}$ by epitaxy. The donor substrate is subjected to ion implantation of helium and then hydrogen. Without it being exclusive to this example, the healing annealing is preferentially performed after these two implantations but can also be done in two steps after each implantation. In this example, the healing annealing is adjusted so as to perform temporary melting of the SiGe layer (that has a melting point lower than silicon) but not of the subjacent silicon. Therefore healing of silicon takes place in the solid phase up to a depth of about 50 nm. Several laser pulses are applied to each point in the donor substrate. The thin layer of SiGe is then removed by selective etching with regard to silicon, so as to restore the initial smooth surface of the donor substrate before epitaxy. If necessary, a chemical-mechanical polishing step can be done at this stage to prepare the surface for future bonding. The donor substrate is then bonded onto a receiving substrate identical to the first example or onto a glass receiving substrate that has a much lower melting point than the temperature used by classical healing heat treatments, generally more than 600° C. The glass receiving substrate is preferably covered by a thin film of SiO2 and subjected to chemical-mechanical polishing ready for bonding. After fracture annealing at 500° C., the transferred silicon layer is thinned by chemical-mechanical polishing to reach a thickness of 30 nm. A "Silicon On Glass" (SOG) layer is thus obtained with electrical properties restored over its entire thickness.

Third Example Embodiment of the Invention

This third example is a variant of the first example.

The ion implantation of the donor substrate by hydrogen is made to create an embrittlement plane at a depth of 500 nm. After this implantation, the donor substrate is amorphised over a thickness of 100 nm by implantation of silicon (with a dose of $10^{15}$ $at/cm^2$ and energy of 50 keV). This substrate is then irradiated with a pulsed layer under conditions similar to those in example 1 but these conditions are adapted to reach the melting point of the amorphous material over the thickness of the amorphised layer, thus enabling its recrystallisation. The remainder of the method is similar to the first example.

The invention claimed is:

1. A method of healing defects generated in a semiconducting layer by an implantation of species made in a substrate to form therein an embrittlement plane separating a solid part of the substrate from the semiconducting layer, the semiconducting layer having a front face through which the implanted species pass, wherein the method comprises a step of heating the semiconducting layer with an intensity that decreases from the front face towards the embrittlement plane implemented by locally annealing the substrate, such that the step of heating the semiconductor layer heals defects in the semiconductor layer.

2. The method according to claim 1, wherein locally annealing the substrate comprises a laser irradiation of a front surface of the substrate.

3. The method according to claim 2, wherein the laser irradiation is a pulse irradiation for which the operating conditions are chosen to heat a front portion of the semiconducting layer without causing the formation of bubbles in the embrittlement plane.

4. The method according to claim 2, wherein the substrate is made of silicon, germanium or silicon-germanium and the laser irradiation has a wavelength of less than 400 nm.

5. The method according to claim 3, wherein the duration of the laser irradiation pulse(s) is less than one microsecond.

6. The method according to claim 3, wherein the laser irradiation pulse(s) (has) have a surface energy density chosen to heat the front portion of the semiconducting layer to a temperature of more than 1000° C.

7. The method according to claim 6, wherein the laser irradiation comprises one or several pulses, each having an energy density chosen to not cause fusion of the front surface.

8. The method according to claim 6, wherein the laser irradiation comprises a single pulse which has an energy density chosen to cause fusion of the front surface.

9. The method according to claim 8, wherein the semiconducting layer is covered by a control layer that has a melting temperature below a melting temperature of the semiconducting layer.

10. The method according to claim 1, further comprising a step of causing surface amorphisation of the semiconducting layer before locally annealing the substrate.

11. The method according to claim 1, further comprising heating the substrate to a temperature chosen to not cause the formation of bubbles in the embrittlement plane.

12. The method according to claim 5, wherein the duration of the laser irradiation pulse(s) is between 20 and 200 nanoseconds.

13. The method according to claim 6, wherein the temperature is more than 1200° C.

14. A method of transferring from a donor substrate to a receiving substrate a semiconducting layer having a front face, the donor substrate comprising an embrittlement plane formed by implantation of species that separates the semiconducting layer from a solid part of the donor substrate, the method comprising the following steps:
  contacting the donor substrate and the receiving substrate to form an assembly to be fractured;
  fracturing the assembly to be fractured along the embrittlement plane so as to transfer the semiconducting layer onto the receiving substrate;
wherein the method further comprises, before the contacting, a step of healing defects generated in the semiconducting layer by the implantation of species through the front face, said healing including locally annealing the donor substrate to cause heating of the semiconducting layer with an intensity that decreases from the front face towards the embrittlement plane.

15. The method according to claim 14, wherein the fracturing includes a weakening heat treatment applied to the assembly to be fractured that heats the embrittlement plane to a temperature higher than a temperature to which it is heated by said healing.

16. The method according to claim 14, also comprising a step of thinning the semiconducting layer transferred onto the receiving substrate.

* * * * *